United States Patent [19]

McCune, Jr. et al.

[11] Patent Number: 5,491,458
[45] Date of Patent: Feb. 13, 1996

[54] APPARATUS FOR SPREADING THE SPECTRUM OF A SIGNAL AND METHOD THEREFOR

[76] Inventors: Earl W. McCune, Jr., 2383 Pruneridge Ave., Suite 3, Santa Clara, Calif. 95050; Narendar Venugopal, 837 Cape Trinity Pl., San Jose, Calif. 95133

[21] Appl. No.: 336,006

[22] Filed: Nov. 8, 1994

[51] Int. Cl.⁶ .............................. H03C 3/00; H03B 29/00; H03K 3/84
[52] U.S. Cl. .............................. 332/144; 331/74; 331/78; 327/164
[58] Field of Search .................................. 332/103–105, 332/144–148; 331/74, 78; 326/21, 93; 327/164, 291; 342/168; 455/1; 375/200

[56] References Cited

U.S. PATENT DOCUMENTS

| | | | |
|---|---|---|---|
| 2,671,896 | 3/1954 | DeRosa | 342/168 |
| 2,953,780 | 9/1960 | Goldfischer | 342/168 |
| 3,878,527 | 4/1975 | Rensin et al. | 375/200 X |
| 4,578,649 | 3/1986 | Shupe | 331/78 |
| 5,416,434 | 5/1995 | Kootstra et al. | 327/164 X |

*Primary Examiner*—David Mis
*Attorney, Agent, or Firm*—Harry M. Weiss; Jeffrey D. Moy; Harry M. Weiss & Associates

[57] ABSTRACT

An oscillator generates a signal that is applied to one input of a phase shifter circuit. The other input of the phase shifter is connected to a source of a phase modulation signal. In response to the phase modulation signal, the phase shifter provides a clock signal with a spread spectrum.

5 Claims, 1 Drawing Sheet

APPARATUS FOR SPREADING THE SPECTRUM OF A SIGNAL AND METHOD THEREFOR

BACKGROUND OF THE INVENTION

1. Field of Invention

This invention is in the field of electromagnetic interference reduction and methods therefore and, more particularly, is a phase modulator for spreading the spectrum of radiated emission of a clock signal and method therefor.

2. Description of the Prior Art

Components of a digital computer, such as a microprocessor, are called upon to operate in synchronism with clock signals of increased frequency as a result of a demand for increased speed of operation of the computer. The increased clock frequency causes an increase of electromagnetic radiation from clock signal lines and all computer signal lines controlled therefrom.

The radiation may cause an undesired coupling of the clock and its related signals to devices that are in proximity to the clock and computer signal lines. The coupling has been reduced by spreading the spectrum of the clock signal and thereby spreading the spectrum of electromagnetic radiation caused by the clock signal. The spreading of the spectrum results in a reduction in the average value of the radiation.

The source of the clock signal has been frequency modulated to provide a frequency modulated clock signal comprised of a multiplicity of frequencies within a spread spectrum. Because the spreading of the spectrum results in the reduction in the average value of the radiation, there is a corresponding reduction in the undesired coupling.

The use of the frequency modulation for spreading the spectrum of a clock signal is described in "Spread Spectrum Clock Generation for the Reduction of Radiated Emissions" by K. B. Hardin, J. T. Fessler and D. R. Bush in a paper submitted to the IEEE 1994 International Symposium on Electromagnetic Compatibility, Aug. 22–26 1994 and in an article entitled "Digital Circuit Radiated Emission Suppression With Spread Spectrum Techniques" in the 1994 issue of ITEM by the same authors. The article states in a reference note that there is a pending patent application relating to the subject matter therein.

Although the use of frequency modulation to spread the spectrum is effective, it is predicated upon access to the source of the clock signal. In an existing system, the access to the source of the clock signal may be impractical.

SUMMARY OF THE INVENTION

An object of the present invention is to provide apparatus and a method of reducing undesired coupling of a clock signal via electromagnetic radiation.

Another object of the present invention is to provide an apparatus and a method for phase modulating a clock signal and method therefor.

BRIEF DESCRIPTION OF THE PREFERRED EMBODIMENT

According to the present invention, a clock signal is phase modulated to spread its spectrum.

The present invention provides an apparatus and a method of spreading the spectrum of an existing clock signal generated by an existing clock signal source.

Other objects, features and advantages of the present invention will be apparent from the following description of the preferred embodiment as illustrated in the accompanying drawing.

DESCRIPTION OF THE PREFERRED EMBODIMENT

Figure 1:
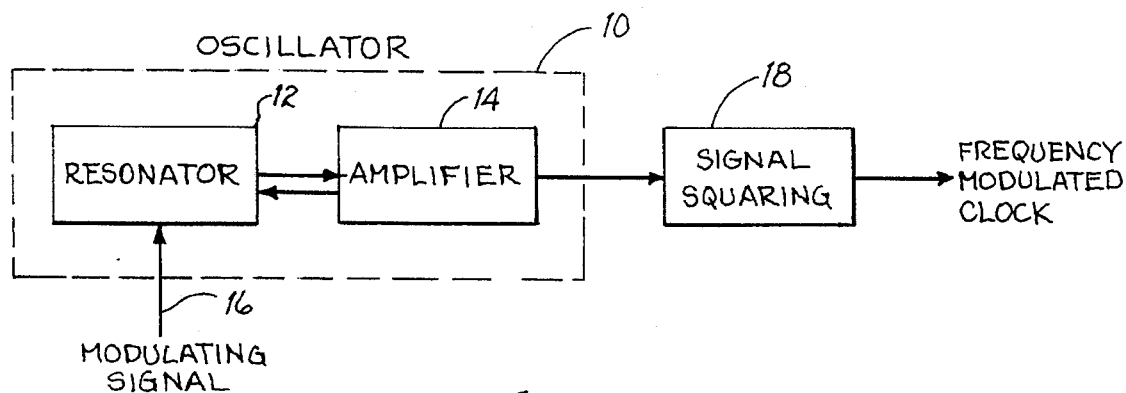
FIG. 1 is a block diagram of a circuit for generating a clock signal having a spread spectrum in accordance with the prior art.

As shown in FIG. 1, in accordance with the prior art, an oscillator 10 is comprised of a resonator 12 that is coupled to an amplifier 14. Resonator 12 usually includes a high Q device, such as a crystal.

Resonator 12 is connected through a signal line 16 to a source of a modulating signal (not shown), whereby the modulating signal is applied to oscillator 10. In response to the modulating signal, oscillator 10 generates a frequency modulated signal at its output.

The output of oscillator 10 is connected to the input of a signal squaring circuit 18. Accordingly, the frequency modulated signal is applied to circuit 18.

The frequency modulated signal may have undesired distortion. However, circuit 18 provides a substantially undistorted frequency modulated signal having a square wave form. Hence, the output of circuit 18 is a clock signal that has a spread spectrum. A disadvantage of the frequency modulation is that it is predicated upon having access to oscillator 10 to apply the modulating signal.

Figure 2:
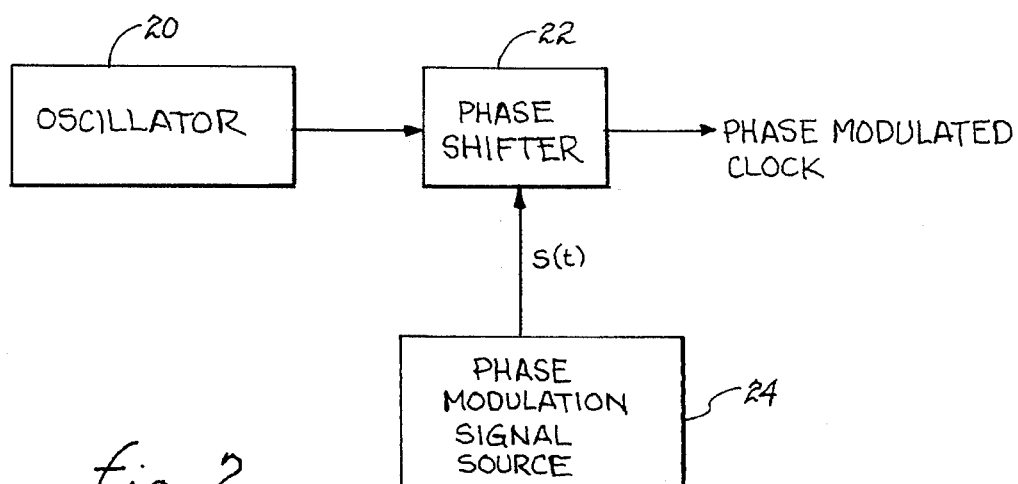
FIG. 2 is a block diagram of the preferred embodiment of the present invention.

As shown in FIG. 2, in accordance with the present invention, an oscillator 20 is connected to one of two inputs of a phase shifter 22. Oscillator 20 generates an unmodulated oscillator signal that is applied to phase shifter 22.

The other input of phase shifter 22 is connected to the output of a phase modulation signal source 24. Source 24 provides a periodic modulation signal to phase shifter 22. Phase shifters are well known to those skilled in the art.

In response to the oscillator signal and the modulation signal, phase shifter 22 generates a phase modulated clock signal at its output. Moreover, the phase modulated clock signal has a spread spectrum similar to the spread spectrum of the frequency modulated clock signal of the prior art.

It should be understood that the frequency of the modulation signal is typically a small fraction of the frequency of the oscillator signal. The frequency of the modulation signal may, for example, be on the order of 30 kilohertz when the frequency of the oscillator is on the order of 15 megahertz.

As known to those skilled in the art, an unmodulated clock signal that has substantially a square wave form with a 50% duty cycle is comprised of a fundamental frequency component and all odd harmonic frequency components. The largest frequency component of the unmodulated clock signal is the fundamental.

Figure 3:
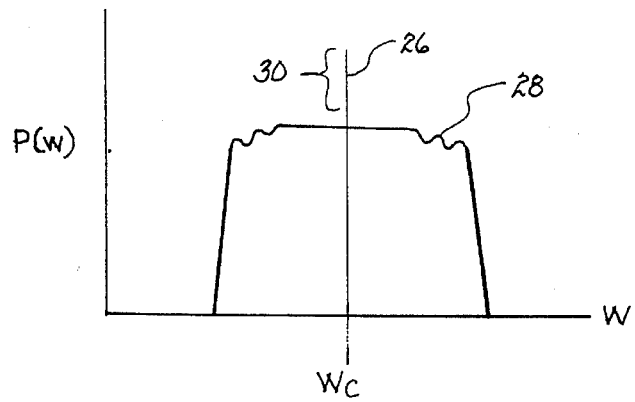
FIG. 3 is graphic representation of portions of power density spectra.

As shown in FIG. 3, the fundamental frequency component of the unmodulated clock signal has a power density spectrum that is an impulse 26 at the fundamental frequency. The phase modulated clock signal has a power density spectrum 28. There is a difference 30 between the peak amplitude of the power density spectrum 28 and impulse 26. Difference 30 is typically 10 decibels. Difference 30 is a measure of the effectiveness of the use of spread spectrum 28 in reducing undesired electromagnetic coupling.

An optimal implementation of the present invention is provided when there is a uniform distribution of harmonics across the spread spectrum. The uniform distribution exists when a single period of the phase modulation signal is in accordance with a relationship which is given as:

$$S(t) = \begin{cases} K_1(P/4-t)^4 + K_2(P/4-t)^2 - C; P/2 > t \geq 0 \\ C - K_1(P/4+t)^4 - K_2(P/4+t); -P/2 \leq t \leq 0 \end{cases}$$

where:

S(t) is a single period of the wave form of the phase modulation signal;

C is an offset constant of the form $(1-p)BP/16+pBP/8$;

$K_1$ is a first gain constant of the form $2pB/P$;

$K_2$ is a second gain constant of the form $(1-p)B/4(P/4)^3$;

P is the period of the modulation wave form;

B is a bandwidth of a power density spectrum resulting from the phase modulation; and p is a scaling factor between 0 and 1.

Typically, the constant, p, has a value of 0.5 and the phase modulation signal has the wave shape of a flattened sine wave.

While the invention has been particularly shown and described with reference to a preferred embodiment thereof, it should be understood by those skilled in the art that changes in form and detail may be made therein without departing from the spirit and scope of the invention.

What is claimed is:

1. Apparatus for causing a clock signal of a digital system to have a power density spectrum, comprising:

an oscillator;

a source of a periodic phase modulation signal;

means for phase modulating the output of said oscillator in response to said phase modulation signal, said phase modulation signal causing said means to provide a phase modulated signal with a power density spectrum within a known bandwidth, said power density spectrum being substantially flat.

2. Apparatus according to claim 1 wherein said means includes a phase shifter circuit.

3. Apparatus in accordance with claim 1 wherein a single period of said phase modulation signal is in accordance with a relationship which is given as:

$$S(t) = \begin{cases} K_1(P/4-t)^4 + K_2(P/4-t)^2 - C; P/2 > t \geq 0 \\ C - K_1(P/4+t)^4 - K_2(P/4+t); -P/2 \leq t \leq 0 \end{cases}$$

where:

S(t) is a single period of the phase modulation wave form;

C is an offset constant of the form $(1-p)BP/16+pBP/8$;

$K_1$ is a first gain constant of the form $2pB/P$;

$K_2$ is a second gain constant of the form $(1-p)B/4(p/4)^3$;

P is the period of the modulation wave form;

B is said bandwidth of said power density spectrum resulting from the phase modulation; and p is a scaling factor between 0 and 1.

4. In the method of spreading the power density spectrum of a clock signal of a digital system, the steps of:

generating an oscillator signal; and phase modulating said oscillator signal in response to a phase modulation signal, a result of said modulation being a modulated oscillator signal that has a power density spectrum within a known bandwidth, said power density spectrum being substantially flat.

5. In the method of claim 4 wherein a single period of said phase modulation signal is in accordance with a relationship which is given as:

$$S(t) = \begin{cases} K_1(P/4-t)^4 + K_2(P/4-t)^2 - C; P/2 > t \geq 0 \\ C - K_1(P/4+t)^4 - K_2(P/4+t); -P/2 \leq t \leq 0 \end{cases}$$

where:

S(t) is a single period of the phase modulation wave form;

C is an offset constant of the form $(1-p)BP/16+pBP/8$;

$K_1$ is a first gain constant of the form $2pB/P$;

$K_2$ is a second gain constant of the form $(1-p)B/4(P/4)^3$;

P is the period of the modulation wave form;

B is said bandwidth of a power density spectrum resulting from the phase modulation; and p is a scaling factor between 0 and 1.

* * * * *